United States Patent [19]

Fraioli et al.

[11] 4,036,634

[45] July 19, 1977

[54] OXIDATION AND SINTER-RESISTANT METAL POWDERS

[75] Inventors: Anthony V. Fraioli, Essex Fells, N.J.; John A. DeRosa, Queens Village, N.Y.

[73] Assignee: Plessey, Incorporated, Mellville, N.Y.

[21] Appl. No.: 655,836

[22] Filed: Feb. 6, 1976

Related U.S. Application Data

[60] Division of Ser. No. 565,835, April 7, 1975, Pat. No. 3,966,463, which is a continuation-in-part of Ser. No. 496,714, Aug. 12, 1974, abandoned.

[51] Int. Cl.$^2$ ............................ C22C 1/05; C22C 5/02
[52] U.S. Cl. ..................................... 75/.5 A; 75/.5 AC
[58] Field of Search ................. 75/.5 A, .5 B, .5 AC, 75/.5 BC

[56] References Cited

U.S. PATENT DOCUMENTS

| | | | |
|---|---|---|---|
| 3,390,981 | 7/1968 | Hoffman | 75/.5 A |
| 3,771,996 | 11/1973 | Short | 75/.5 A |

*Primary Examiner*—W. Stallard
*Attorney, Agent, or Firm*—James J. Burke

[57] ABSTRACT

A high density precious metal powder that resists sintering at 600° C. and contains a very small percentage of titania or zirconia is produced by co-nucleation and precipitation of gold and titania from an ammoniacal solution at pH 3–4 with a bisulfite.

A nickel powder including a very small percentage of a refractory oxide such as zirconia is prepared by co-nucleation and precipitation from an alkaline solution with hydrazine.

Materials so prepared have oxidation resistance and sintering temperatures superior to the pure metal, and find utility in microelectronics as air-fired thick films. Nickel powders so prepared are also useful as hydrogenation catalysts and in other applications.

1 Claim, No Drawings

OXIDATION AND SINTER-RESISTANT METAL POWDERS

RELATED APPLICATIONS

This application is a division of application Ser. No. 565,835 filed Apr. 7, 1975, now U.S. Pat. No. 3,966,463 issued June 29, 1976, which was a continuation-in-part of application Ser. No. 496,714 filed Aug. 12, 1974, now abandoned.

BACKGROUND OF THE INVENTION

In the above-noted co-pending aplication, there is disclosed a method of co-nucleating precious metal powders with a small percentage of a refractory oxide, most particularly titania or zirconia. The process involves a slow precipitation form an acidic solution with ammoniacal hydrazine, followed by a heat treatment. Such powders exhibit increased sintering temperatures, and find utility when formulated as pastes, with a small amount of glass frit as binder, in thick film electronic applications, and in catalysis.

The present invention is based, in one part, on the discovery that with a somewhat altered procedure, the process described above can be applied to nickel and the product exhibits a significantly increased oxidation resistance. The present invention is based, in a second part, on the discovery that with an essentially different process, precious metal powders of both increased density and higher sintering temperatures are produced.

In the above-mentioned co-pending application, it is noted that the addition of refractory oxides as distinct ingredients in certain thick film compositions is know, that the addition of copper oxide to gold to make a so-called "fritless" thick film conductors is know, and that it is also known to improve bulk metal properties such as creep strength and tensile strength with a refractory oxide as a distinct second phase, e.g. dispersion hardening. The surprising and novel aspect of the present invention, as well as that described in said co-pending application, is the significantly improved thermal properties of metal powders produced in accordance herewith.

OBJECTS OF THE INVENTION

A general object of the present invention is to provide improved metal powder compositions.

Another object of the present invention is to provide improved thick film pastes.

A further object of the present invention is to provide improved metal films for electronic and catalytic applications.

A still further object of the present invention is to provide metal powder compositions including small amount of co-nucleated ceramic oxides.

A more specific object of the present invention is to provide a precious metal powder of both higher sintering temperature and higher density than powders heretofore available.

Another specific object of the present invention is to provide nickel powders including small amounts of a co-nucleated oxide, most particularly zirconia, which exhibits improved oxidation resistance.

Yet another object of the present invention is to provide an improved nickel catalyst material.

Various other objects and advantages of the invention will become clear from the following description of embodiments thereof, and the novel features will be particularly pointed out in connection with the appended claims.

DESCRIPTION OF EMBODIMENTS

A high density metal powder is prepared by co-nucleation and precipitation of the metal and titania or zirconia from an ammoniacal solution maintained at a pH in the range of 3–4 with sodium bisulfide. As starting materials, chloroplatinic acid, palladium chloride, chlorauric acid or similar solutions are used. For the refractory oxide component, titanium tetrachloride or disulfato zirconic acid are preferred.

In the above-noted co-pending application the precipitation is carried out with hydrazine hydrate and ammonium hydroxide, and the resulting product must be fired at around 650° C. to achieve desired results. By contrast, the present invention precipitates the metal-oxide combination with a bisulfite, and there is no requirement for firing to achieve both high density and increased sintering temperature. The specific procedure for preparing a high density gold powder in accordance with the invention is set forth below in Example I.

The procedures for preparing nickel powders in accordance with the invention are similar in general to the procedures disclosed in the noted co-pending application for precious metals, but with some specific changes. More particularly, while the nickel powder must be fired, this is done in hydrogen or another reducing atmosphere to prevent nickel oxidation. Because of this firing, it is preferred to use zirconia rather than titania as the oxide component, because the former has greater resistance to reduction in the hydrogen environment. As in the prior co-pending application, the reaction rates must be controlled, and are very important to achieve the desired results, but in this case they must be quite significantly slower.

Generally, a nickel powder in accordance with the present invention is prepared as follows.

A first solution is prepared containing the metals in desired proportions. This can conveniently be nickel chloride and Jisulfato zirconic acid. A second solution is then prepared containing sodium hydroxide, hydrazine hydrate and water. The latter is heated to about 90°–95° C. under conditions of agitation. Because the precipitate will be magnetic, a propeller rather than a magnetic stirrer should be used. The nickel-zirconia solution is then added thereto very slowly, essentially drop-by-drop, at a rate of no more than about 10 ml/min. Agitation is continued until all gas generation has ceased. The precipitate is filtered out, dried, pulverized, washed to remove residual chloride, dried again, screened and fired in hydrogen for about an hour at 400°–500° C. A specific example of nickel powder production is set forth below in Example II.

To appreciate the improved properties of powders produced in accordance with the invention, it is necessary to be aware of certain conventions. Thus, when one speaks of powder density, the reference is not to bulk density, but rather the tap density, a standard measure for such powders. A conventional gold powder will have a tap density of about 4 gm/cc; a gold powder produced in accordance with the prior co-pending application had a tap density of 5.2 gm/cc; the powder product of Example I below had a tap density of 6.7 gm/cc. It is to be noted that higher tap density improves thixotropic and rhelogical properties of thick film pastes.

As used herein, the work sinter or sintering temperature also has a special meaning. After powders are formulated into thick film pastes, usually with a glass frit as binder, they are screened onto ceramic substrates in a desired pattern, dried and fired. The film is generally of the order of one mil thick. A conventional firing cycle for a platinum-palladium conductor paste is 10–20 minutes at 800°–850° C. in air. If the firing temperature is too high for a particular composition, however, the film will sinter, by which is meant that it beads, balls up, crazes or, in essence, in other than a smooth, continuous metallic film with a good finish. While the sintering temperature is a function of the melting point of the metal or alloy, it can be very substantially lower; pure gold powders that sinter at 400° C. are know, whereas a gold in accordance with the present invention shows no sign of sintering when fired at 600° C. This is important in thick film work because it affects the choice of glass used in the paste, which must melt at the firing temperature, and also dictates the maximum temperature at which other processing steps can be carried out.

As noted hereinabove, nickel powders according to the present invention exhibit increased oxidation resistance, but this term too must be considered in the proper context. Oxidation properties of a metal are normally those of the bulk metal, but it must be appreciated that oxidation is also a function of particle size, and resistance to oxidation drops with particle size due to surface energy factors, (i.e. magnesium metal is stable but in powder form it is explosively pyrophoric). Thus, standard texts will advise that nickel oxidizes to NiO in air between 350° and 700° C. at a parabolic rate. However, with nickel powders of the size here under consideration, those having above about 30 $m^2$/gm surface area, one would expect rapid and substantial oxidation in air at room temperature. The fact that co-nucleated nickel powder in accordance with the present invention can withstand one hour in air at 450° C. with no measurable weight gain is thus truly remarkable.

Understanding of the invention will be facilitated by referring to the following specific examples thereof, which are illustrative only and are not to be interpreted in a limiting sense.

EXAMPLE 1

It was desired to produce a gold powder including 0.5% by weight of titania. A solution of the following composition was prepared:

| | |
|---|---|
| Chlorauric acid (HAuCl$_4$) (0.3gmAu/ml) | 166 ml |
| titanium tetrachloride in 3N HCl (TiCl$_4$) (0.25gmTi/ml) | 6 ml |
| DI water | 338 ml |

The gold solution is poured, over a span of one minute, into stirred, diluted ammonia, containing 110 ml. of 28–30% NH$_3$, and 780 ml. DI-water. A clean 2000 ml. pyrex beaker serves as the reaction vessel. After being stirred an additional 5 minutes, the ammoniated gold slurry is neutralized (pH 6–7) with 3N-HCl. For reduction to metallic gold, this slurry is heated to 50° C., preferably with a quartz or pyrex immersion heater, and then 10 gm. of anhydrous sodium acetate is added and dissolved. With the source of heat removed, 40 gm. of anhydrous sodium bisulfite is added once to the stirred mixture. The temperature rises to about 60° C., and the pH drops to and remains at 4 throughout the reduction. The product coagulates in about 15 min., but stirring is continued for 15 min. more, while the reaction temperature is maintained at about 55° C., using the immersion heater if necessary. After being washed several times with DI-water by decanting, the product is further dispersed and densified in a one quart commercial Waring Blender. The wet product is added to the blender containing 100 ml. DI-water and 1.25 gm. cyanoguanidine. After blending at low speed twice for 30 seconds, the contents are poured into a 400 ml. beaker for settling and decanting. The gold is then dried at 125° C. and screened through a 140 mesh sieve. Yield is about 98%. Tapped packing density is 6.7. Average particle size (Fisher Subsieve Sizer) is 4.1. Surface area (BET) is 0.8.

EXAMPLE II

It was desired to produce a nickel powder containing 2% $ZrO_2$.

A solution containing 162.5 ml. of 6.25 N-NaOH, 32.5 ml. of 85% hydrazine hydrate, and 55 ml. DI-water is heated at 90°–95° C. in a 1000 ml. beaker, which is fitted with a polypropylene propeller mixer. To the hot solution is added from a separatory funnel, at a rate of 10 ml. per minute, a solution of nickel chloride, containing 24.5 gm. Ni, and disulfatozirconic acid, equivalent to 0.5 gm. $ZrO_2$. After the addition, mixing is continued for about 15 minutes at 90° C. The mixture is filtered without washing through a 600M glass buchner funnel, then dried on the funnel at 125° C. The mass is then pulverized in a mortar to pass a 100 mesh sieve. In this condition the product is washable by decanting with hot DI-water until free of chloride. After drying at 125° C. and screening through 100 mesh, the product is placed in a shallow graphite boat and fired in a hydrogen furnace at 450° and at 600° C. The resulting powder properties at these firing temperatures are set forth below:

| | 450° | 600° |
|---|---|---|
| Loose Packing Density: | 1.5 gm/cc | 1.8 gm/cc |
| Tapped Packing Density: | 1.9 gm/cc | 2.4 gm/cc |
| Surface Area | 42.7 $m^2$/gm | 30.4 $m^2$/gm |
| Average Particle Size | 1.46 μm | 2.38 μm |

EXAMPLE III

The product of Example II was heated in air for 1 hour at 450° C. and gained no weight, indicating significant resistance to oxidation.

Various changes in the details, steps, materials and arrangements of parts, which have been herein described in order to explain the nature of the invention, may be made by those skilled in the art within the principle and scope of the invention as defined in the appended claims.

What is claimed is:

1. A gold powder consisting essentially of gold and no more than about two percent of a coprecipitated oxide selected from the group consisting of titania and zirconia, in an amount sufficient to achieve a tap density greater than 6 and a sintering temperature higher than 600° C.

* * * * *